United States Patent [19]

Lowery et al.

[11] Patent Number: 4,477,769

[45] Date of Patent: Oct. 16, 1984

[54] CABLE PLEXER FAULT LOCATOR

[75] Inventors: James O. Lowery, Ranburne, Ala.; O. Leon Thomas, Carrollton, Ga.; Nathan I. Baston, Bremen, Ga.; Darrell L. Smith, Carrollton, Ga.; Walter K. Jiles, Whitesburg, Ga.; R. Emory Starnes, Jr., Carrollton, Ga.

[73] Assignee: Southwire Company, Carrollton, Ga.

[21] Appl. No.: 362,726

[22] Filed: Mar. 29, 1982

[51] Int. Cl.³ .......................................... G01R 31/12
[52] U.S. Cl. ............................................. 324/54
[58] Field of Search ................. 57/19; 324/54, 52, 51

[56] References Cited

U.S. PATENT DOCUMENTS

| 2,894,204 | 7/1959 | Gambrill | 324/54 |
| 3,310,735 | 3/1967 | Peschel | 324/54 |
| 3,345,812 | 10/1967 | Pickering | 57/19 X |
| 3,988,666 | 10/1976 | Rowland | 324/54 |

Primary Examiner—Stanley T. Krawczewicz
Assistant Examiner—Jose M. Solis
Attorney, Agent, or Firm—Herbert M. Hanegan; Robert S. Linne; Michael C. Smith

[57] ABSTRACT

Apparatus and method for detecting and locating insulation faults in lengths of electrical conductive cable and plexing those lengths of cable into multiplex cable in one operation, wherein the multiplex cable includes either a bare cable and a plurality of insulated cables stranded together or a plurality of insulated cables stranded together.

26 Claims, 11 Drawing Figures

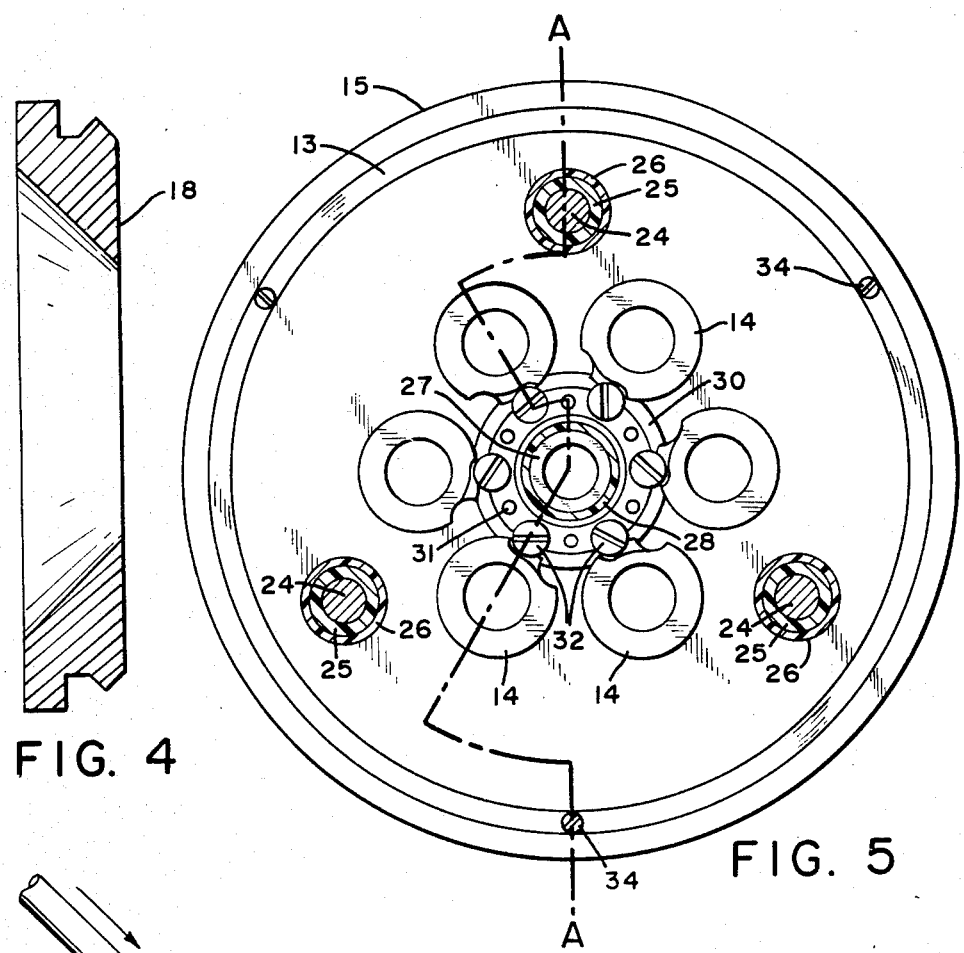
FIG. 4
FIG. 5
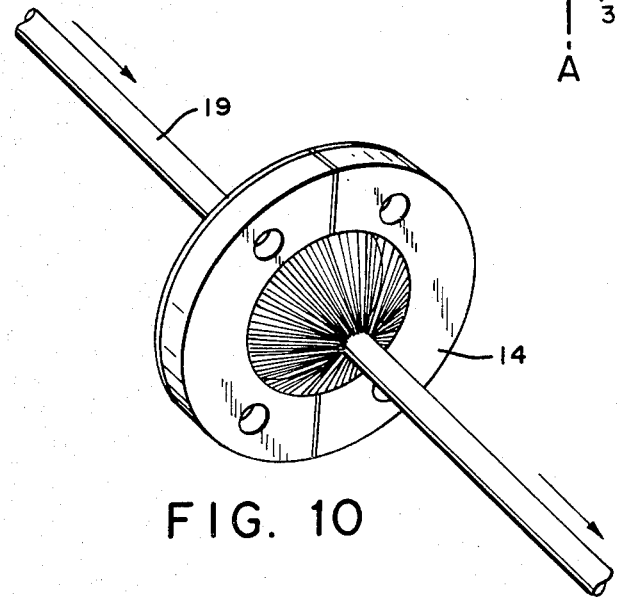
FIG. 10
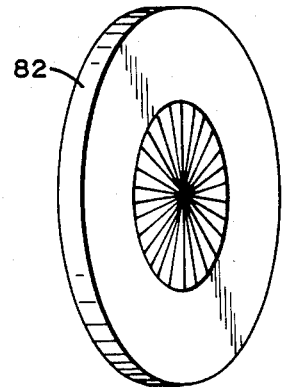
FIG. 9

CABLE PLEXER FAULT LOCATOR

TECHNICAL FIELD

The present invention relates generally to cable making, and specifically to an apparatus and a method for locating insulation faults in cable as the cable is being plexed into multiplex cable which may include an uncovered conductor.

BACKGROUND ART

Until the present invention, several insulation fault testing methods have been used. In the conventional water test system, rolls of multiplex cable are put in a water tank and voltage is applied. The results can show the existence of a fault or faults in a roll of cable but the fault locations are not known. This system is very time consuming. In another test system, cable is wound from one spool to another with a water test in between. This test is dangerous to operating personnel. In both of these systems, water flows into the cable through faults which contaminates the conductor and which makes patching of such faults difficult and ineffective.

When all strands of multiplex cable are insulated, faults can be located by sending the multiplex cable through a spark tester. However, since most multiplex cable contains one bare conductor, a system which would test each insulated strand while isolated from the bare strand was needed. U.S. Pat. No. 3,988,666 accomplished this by unplexing multiplex cable, isolating the bare strand, spark testing the insulated strands and replexing the multiplex cable.

These prior art methods are costly because they involve additional handling, consume time and often one test will apply to only one type of multiplex cable, i.e., one bare strand or all insulated strands.

DISCLOSURE OF INVENTION

The present invention solves the problems of dual handling because insulation fault testing is incorporated into the plexing operation and because it will test both types of multiplex cable. As the cable is being plexed, each insulated strand is fault tested. With little or no adjustment, this apparatus will test multiplex cable with one bare strand or with all insulated strands. The present invention is safer and much more efficient than the prior art.

As the several cables are stranded together, an electric potential (electro motive force) is applied around each insulated cable so that one can by electrical signal, locate and mark the fault or record the measured location of the fault. The apparatus includes a multiplicity of discs which rotate in unison. Together the discs guide strands of cable in straight lines through one of the discs which contains electrodes. A high voltage signal is placed on the electrodes, which set up emf fields around the portions of insulated strands in each electrode. By means of fault testers insulation faults are detected as the strands pass through the emf fields. The last disc winds the several strands around a central strand. Thus in one operation, separate untested strands of cable are insulation fault tested and wound into multiplex cable by the present invention.

Thus it is an object of the present invention to provide an apparatus and a method for fault testing strands of insulated conductors and plexing them with or without a bare strand to produce fault tested multiplex cable in one step.

Another object of this invention is to provide an apparatus which identifies faults in terms of location and quantity to provide for more effective remedial measures.

Still another object of the present invention is to provide a dynamic apparatus and a flexible method for fault testing and plexing multiplex cables of various strand quantities.

Yet another object of this invention is to provide an apparatus comprising components designed for long service life.

BRIEF DESCRIPTION OF THE DRAWINGS

While the specification concludes with claims particularly pointing out and distinctly claiming the subject matter which is regarded as the invention, it is believed that the invention, objects, features and advantages thereof will be better understood from the following description taken in connection with the accompanied drawings in which like parts are given like identification numerals and wherein:

FIG. 4 is a cross-sectional view of a snap locking plastic insulator;

FIG. 5 is a front view of the fault tester disc of the present invention;

FIG. 9 is a perspective of a brush electrode insert;

FIG. 10 is a perspective of a brush electrode assembly; and

BEST MODE FOR CARRYING OUT THE INVENTION

Figure 1:
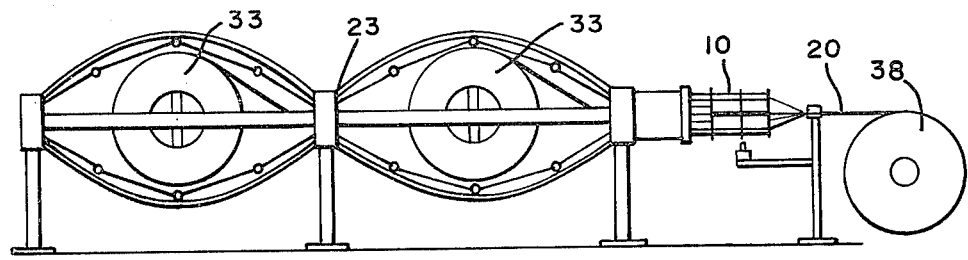
FIG. 1 is a schematic of a conventional plexing machine adapted with the present invention.
Figure 2:
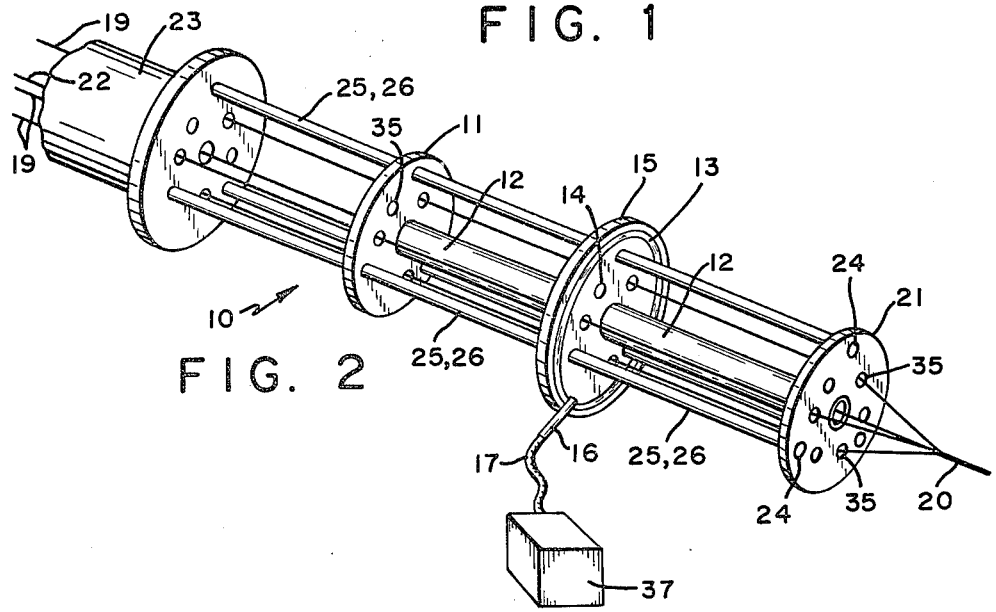
FIG. 2 is a front perspective view of the preferred embodiment of the present invention.
Figure 3:
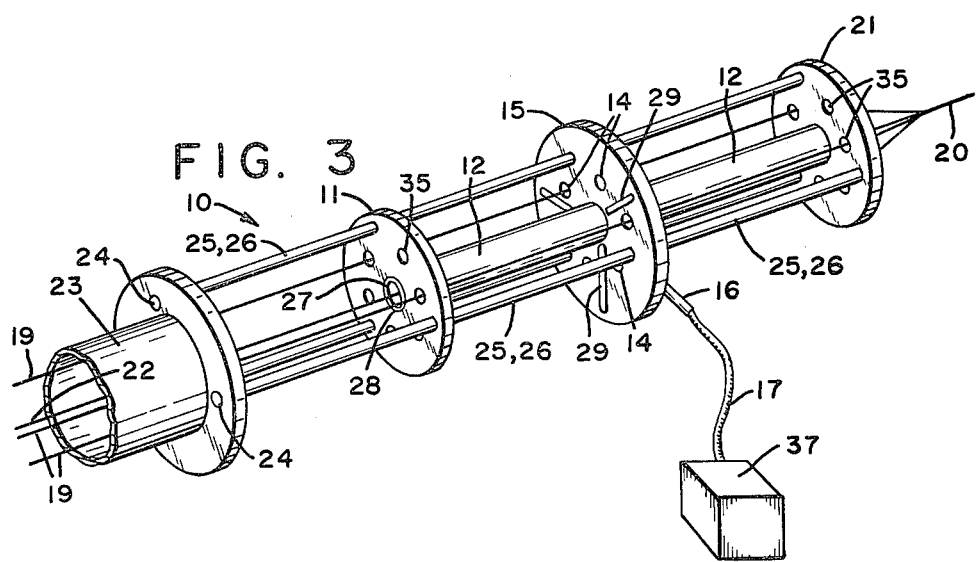
FIG. 3 is a rear perspective of the preferred embodiment.

As illustrated by FIG. 1, the plexer fault locator 10 is mounted at the rotatable nose of a conventional plexing machine 23. As FIG. 2 and FIG. 3 illustrate, the cable insulation fault locator and multiplexer indicated generally at 10 comprises three discs rotatable in unison about the longitudinal axis of the multiplex cable 20 by rotation means of machine 23. They are an entrance disc 11, a fault tester disc 15 and an exit disc 21. Each disc is concentric with the longitudinal axis of the multiplex cable 20, and in each disc there are ten apertures, one in the center, six symmetrically placed intermediate about the central aperture, and three close to the outer edge of the disc at one hundred twenty angular degrees from each other. An alternate mode will have four instead of six apertures symmetrically spaced around the central aperture. Two or more such symmetrically placed intermediate apertures and two or more outer apertures are anticipated. In each of the entrance and exit discs 11 and 21 a polished ceramic insulator ring guide 35 is mounted in each of the six apertures to reduce scratching of the cable and to prevent electrical leakage to the cable while guiding cable through the apparatus 10. Each polished ceramic insulator ring guide 35 is detachably secured in place within the disc by a snap locking plastic insulator 18 as shown in FIG. 4, adapted to snap into a V-groove within the intermediate aperture. Mounting bolts 24, each covered by solid PVC turbular insulators 25 having an outer diameter smaller than the aperture diameter, pass through the three outer interconnection apertures of each disc and through insulating spacer rods 26 which are made of delrin or some other insulator, which have inner diameters larger than the outer diameter of tubular insulators 25 and outer diameters larger than the diameter of the interconnection aperture, and which space the discs apart and align the remaining apertures so that a straight line perpendicular to the generally flat surface of the discs and passing through any of the apertures will pass through the corresponding apertures in the other two discs. Thus, seven straight cable paths parallel to the longitudinal axis of the multiplex cable are formed through the three discs.

From two to seven cables can be tested and plexed by this apparatus 10. If one of the cables to be plexed is bare, it is the core cable 22 and it passes through the center aperture of the discs. Since bare cable cannot be insulation fault tested and since its contact with insulated cables 19 will disrupt their testing, it must be isolated (temporarily insulated). In FIG. 2 and FIG. 3 the bare core cable 22 passes through ground insulating tube 12 concentric with the longitudinal axis of the multiplex cable path. Tube 12 comprises a series of three tubular ceramic wear rings 27 encased in a tubular nylon casing 28 and spaced apart by nylon spacer tubes 36 having inner and outer diameters approximately equal to those of the wear rings 27, such that each wear ring 27 is aligned concentric within and parallel to its corresponding disc. In the alternative, ground insulating tube 12 comprises carbide metal rings 27 covered by a PVC insulator tube 28 to temporarily insulate core cable 22.

If all of the strands of the multiplex cable 20 are insulated they must all be tested. In this case, if more than six cables 19 are to be tested and plexed, the ground insulating tube 12 is removed, guides 35 are inserted in the central apertures of the entrance disc 11 and the exit disc 21, and an electrode 14 is inserted in the center aperture of the fault tester disc 15. The fault tester disc 15 is made of solid cast PVC or some other insulator to resist high voltage stress and to prevent electrical leakage.

If only three cables are to be plexed, one of them being a bare conductor, the operator simply uses opposing electrodes 14. While near perfect rotational balance is achieved by using two, three or six outer electrodes 14, no substantial imbalance is present when four or five outer electrodes 14 are used.

Spools of cable (33 of FIG. 1) are arranged within the plexing machine 23 in a sequence to provide a smooth and steady flow of cable into the present invention 10. Strands of cable 19 and 22 follow paths through apertures in the entrance disc 11 and rotate about the longitudinal axis of the multiplex cable while advancing along straight paths through the three disc mechanism 10. The cables 19 pass through apertures in the fault tester disc 15 and electrodes 14 mounted therein.

One or more spring loaded contacts 16, which are made of copper or some other electrical conductor, are mounted on stationary portions of plexer 23. Contacts 16 are in constant touch with a contact ring 13 which is made of bronze, copper or another electrical conductor and is secured in a groove on the front face of the fault tester disc 15 (nearest to the exit disc 21) by screws 34 of FIG. 5. Contact ring 13 has an inner diameter slightly larger than the outer diameter of the exit disc 21 in order to allow removal of contact ring 13 over exit disc 21 without extensive dismantling of the apparatus 10. Each contact 16 is secured to a stationary portion of machine 23 by an insulating material so that no metal portion is within about 8 inches of the communication means. Silicone insulated 40 KV cable 17 connects each contact 16 to an external power supply 37. Three electrical conductive connecting braces 29 connect electrodes 14 to the contact ring 13. Thus communication means are provided for the transmission of fault data by conducting an electrical signal between the electrodes 14 and the outer portion of the fault tester disc 15.

Application of high voltage produces an electro motive force (emf field) around each portion of cable 19 which is surrounded by the electrode 14. When an insulation fault passes through any of these emf fields, changes in the electrical signal caused by completion of the circuit to the grounded conductor of the insulated cable are detected. This occurs by electrical arc (flow of electrons) from electrode 14 through a fault in the cable insulation to the grounded conductor of cable 19 because of the potential difference. The machine operator or associated apparatus can locate and mark the fault or record the measured location of the fault. After the cables 19 have been tested, they pass from the electrodes 14 in the fault tester disc 15 in a straight line to the guides 35 of the exit disc 21.

As the cables 19 exit the exit disc 21 the rotation of the three discs in unison and the pull exerted by a take-up spool (38 of FIG. 1) cause the cables 19 to change from their straight paths to paths which wind them around the core cable 22. The newly tested and plexed multiplex cable 20 is then pulled onto the take-up spool 38.

Figure 7:
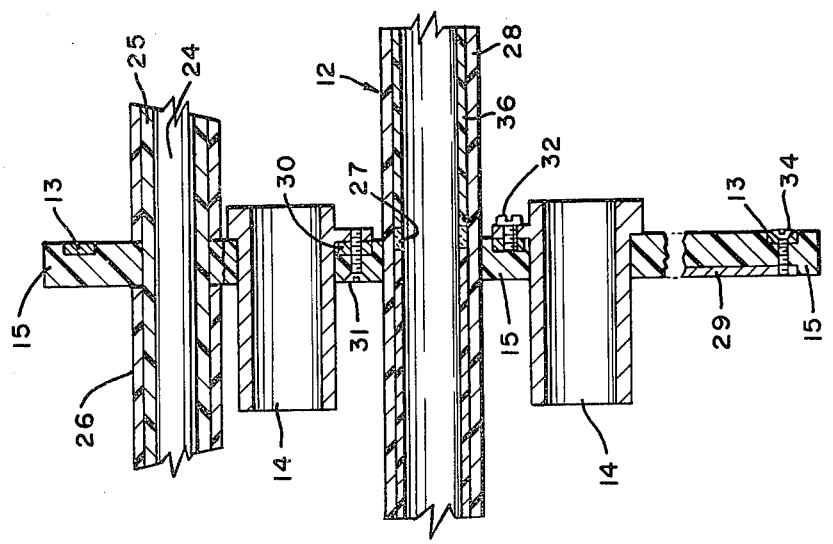
FIG. 7 is a cross-section of the fault tester disc taken along line A—A of FIG. 5.
Figure 6:
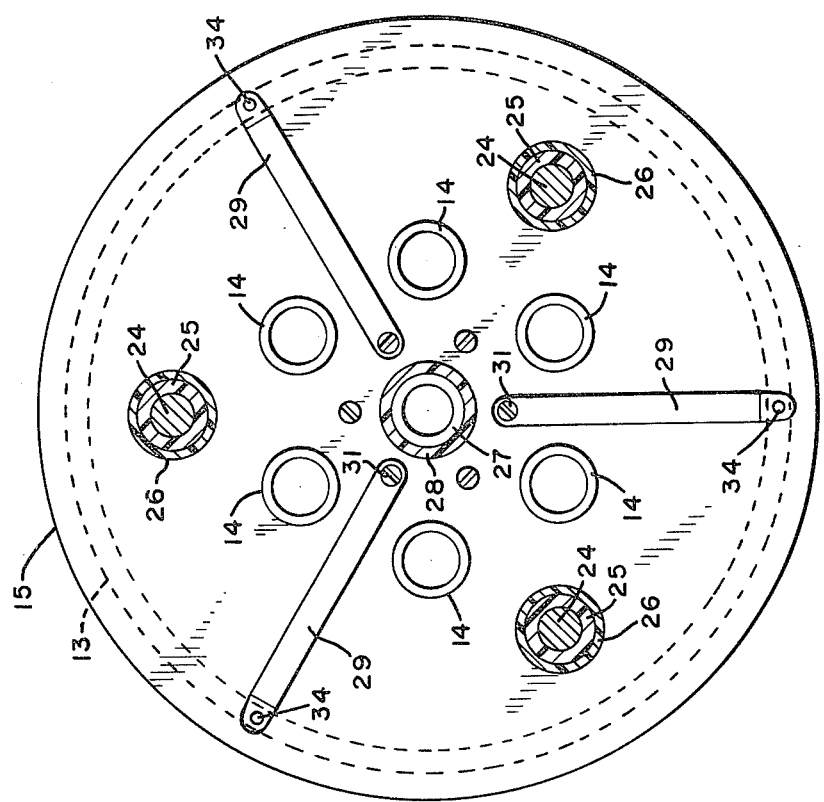
FIG. 6 is a rear view of the fault tester disc of the present invention.

FIGS. 5, 6 and 7 illustrate the fault tester disc 15 in more detail by showing the front, rear, and cross-section respectively. A central connecting ring 30 interconnects each electrode 14 and is connected by conductive screws 31 to each conductive connecting brace 29. Fault detection communication paths are thus created from each electrode 14, through connecting ring 30, through screws 31, through connecting braces 29 and through contact ring 13.

Several specific types of electrodes 14 are contemplated. The first contemplated electrode 14 is a conductive metal bushing. As shown in FIGS. 5, 6, and 7, each metal bushing electrode 14 has an enlarged outer diameter at its rear portion and is held in contact with the fault tester disc 15 and the central connecting ring 30 by a screw 32. In operation, with the application of about 25,000 volts (40 KV maximum), a hole in the cable will draw a spark approximately two inches before entering the electrode 14. This allows the cable passageway diameter of the metal bushing electrode 14 to be about one and one quarter inches which permits easy passage of wire splices. The nylon spacer tube 36 is also more clearly shown in FIG. 7.

Figure 8:
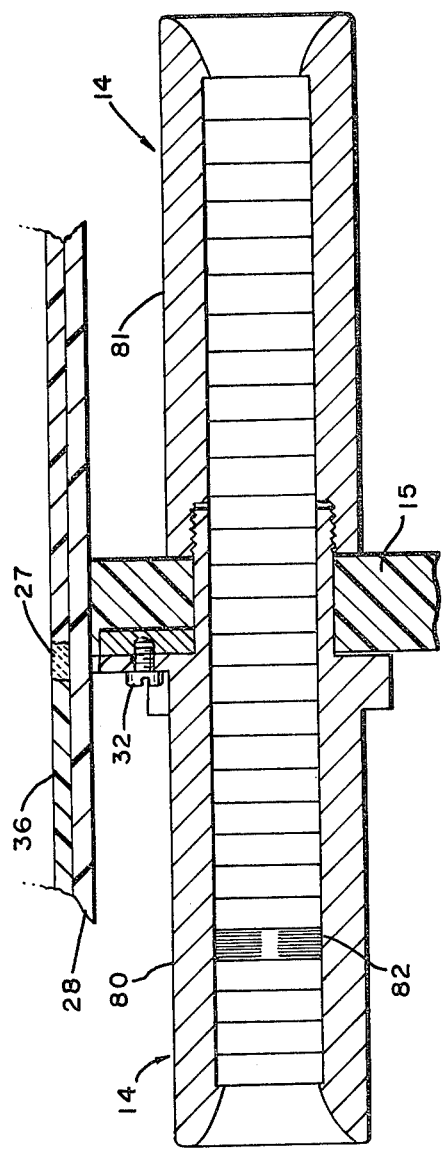
FIG. 8 is a cross-sectional view of a multiple brush electrode assembly.

The second contemplated electrode 14 is a multiple brush insert electrode 14 shown in FIG. 8. This electrode 14 comprises two elongated mating portions 80 and 81 which are joined at the fault tester disc 15 thereby forming longitudinal extensions before and after the fault tester disc 15. Within the mated portions 80 and 81 a multiplicity of brush electrode inserts 82 are housed to form a length of electrode testing zone required to effectively test the advancing conductor at various speeds. This elongated configuration is particularly useful at high speeds. The full length of the cable within the testing zone substantially contacts the electrode. The brush electrode insert 82 is shown more clearly in FIG. 9.

Figure 11:
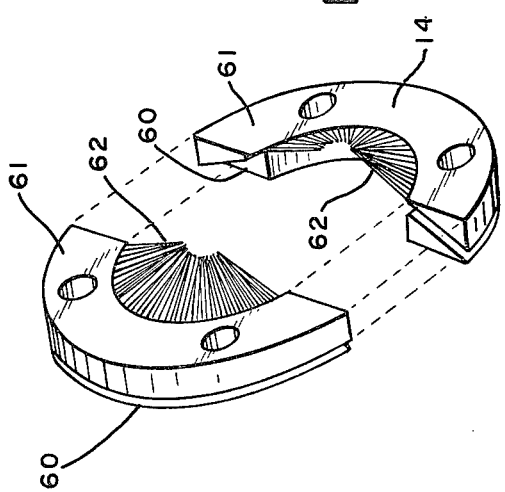
FIG. 11 is an exploded view of a brush electrode assembly.

FIG. 10 shows a third contemplated type of electrode, a brush electrode assembly 14, and the passage of cable 19 through it in a straight line. The straight paths from the entrance disc 11 to the exit disc 21 cause the cables 19 to pass through electrodes 14 without fluctuating which avoids undue damage to the bristles of the brush electrodes 14 even though the entire three disc mechanism is rotating at high speed. The brush electrodes 14 are also designed for long service life. FIG. 11 illustrates this design. The brush electrode assembly 14 comprises four generally crescent shaped brush holders 60 and 61 and the electrode brush 62. The two leading holders 60 are formed in such a manner that their cross-sections are triangular with one side of the triangle parallel to the flow of the cable and located on the side of the holder adjacent to the cable. The two following holders 61 are formed so their cross-sections are also triangular but their sides parallel to the flow of the cable are located on the outer portion of the brush electrode assembly 14. When the leading and following brush holders are bolted together, their cross-sectional triangles form a rectangle with a seam from the outside leading edge to the inside following edge of the assembled holders. The electrode brush 62 is mounted in this seam so that its bristles strike the cable at about thirty clockwise angular degrees after perpendicular to the longitudinal axis of the cable path. This assembly permits substantially total contact around the cable 19 with little stress on the bristles thus preventing excessive wear and lengthening the life of the electrode brush 62. When the four brush holders 60 and 61 and the electrode brush 62 are mounted in the fault tester disc 15, a circular brush electrode 14 is assembled. This circular design provides substantially total circumferential contact of the bristles with the cable being tested. As shown in FIG. 11, when a leading brush holder 60 and a following brush holder 61 are aligned by their mounting holes, the ends of the holders are offset. When all four holders are assembled, this offset allows the sections to overlap slightly, assuring complete contact among the holders. This component design of the brush electrodes 62 makes it possible to reuse some detail parts of the assembly when other detail parts are worn out, simply by replacing only those worn parts. The design also allows replacement of any part or the complete assembly without the necessity of cutting or otherwise disturbing the cable. In addition, this component brush electrode 14 may be used as the insert 82 for the FIG. 8 electrode 80, 81.

This embodiment is, of course, merely exemplary of the possible changes or variations. Because many varying and different embodiments may be made within the scope of the inventive concept disclosed herein and because many modifications may be made in the embodiment herein detailed in accordance with the descriptive requirements of the law, it should be generally understood that the details herein are to be interpreted as illustrative and not in a limiting sense.

INDUSTRIAL APPLICABILITY

This invention is capable of exploitation in the cable manufacturing industry and is particularly useful in a multiplex operation.

What is claimed is:

1. Apparatus for insulation fault testing and plexing strands of cable into multiplex cable comprising:
    (a) a frame rotatable about the longitudinal axis of the multiplex cable path;
    (b) an entrance disc secured to said frame, concentric with said longitudinal axis, and having a series of symmetrically spaced cable entrance guide means;
    (c) a fault tester disc secured to said entrance disc by insulating mounting means, concentric with said longitudinal axis, and having a series of symmetrically spaced cable testing means;
    (d) an exit disc for plexing said strands of cable, secured to said fault tester disc by insulating mounting means, concentric with said longitudinal axis, and having a series of symmetrically spaced cable exit guide means;
    (e) means for maintaining a straight cable path parallel to said longitudinal axis and rotatable about said longitudinal axis from each entrance guide means, through each cable testing means, and to each exit guide means;
    (f) means for rotating said frame, said entrance disc, said fault tester disc, and said exit disc along said longitudinal axis in unison;
    (g) means for transmitting fault data from said fault tester disc; and
    (h) means for applying a high voltage to said cable testing means thereby forming an electro motive force field around a portion of each strand to be tested.

2. The apparatus of claim 1 further comprising means for supplying lengths of cable to said entrance disc and means for collecting a length of multiplex cable from said exit disc.

3. The apparatus of claim 1 wherein said insulating mounting means further comprises:
    a mounting bolt passing through corresponding outer passageways in each of said discs;
    a tubular insulator having an outer diameter slightly smaller than the diameter of said outer passageway covering said mounting bolt and passing through corresponding outer passageways in each of said discs; and
    a tubular insulating spacer, having an inner diameter slightly larger than the outer diameter of said tubular insulator and an outer diameter larger than the diameter of said outer passageway, covering the portion of said tubular insulator between each disc and spacing said discs apart.

4. The apparatus of claim 3 wherein said tubular insulator further comprises a solid PVC tubular insulator.

5. The apparatus of claim 3 wherein said tubular insulating spacer further comprises a delrin tubular insulating spacer.

6. The apparatus of claim 1 further comprising means for isolating an uninsulated cable.

7. The apparatus of claim 6 wherein said isolation means further comprises a ground insulating tube extending through the central portion of each of said discs.

8. The apparatus of claim 7 wherein said ground insulating tube further comprises:
   a first ceramic wear ring housed concentric within and parallel to said entrance disc;
   a second ceramic wear ring housed concentric within and parallel to said fault tester disc;
   a third ceramic wear ring housed concentric within and parallel to said exit disc;
   a first nylon spacer tube, having outer and inner diameters approximately equal to those of said ceramic wear rings, and positioned concentric with said longitudinal axis and between said first and said second ceramic wear rings;
   a second nylon spacer tube, having outer and inner diameters approximately equal to those of said ceramic wear rings, and positioned concentric with said longitudinal axis and between said second and said third ceramic wear rings; and
   a tubular nylon casing housing said ceramic wear rings and said nylon spacer tubes.

9. The apparatus of claim 7 wherein said ground insulating tube further comprises a carbide metal ring covered by a PVC insulator tube.

10. The apparatus of claim 1 wherein said means for transmitting fault data from said fault tester disc further comprises one or more contacts mounted on stationary portions of said apparatus, spring loaded against a contact ring mounted on the outer portion of said fault tester disc, and extending to power supply means.

11. The apparatus of claim 10 wherein said contact is secured to said stationary portion by insulating material such that no uninsulated metal components are within about eight inches of said communication means.

12. The apparatus of claim 10 wherein said contact is connected to said power supply by silicone insulated 40 KV cable.

13. The method of identifying cable insulation faults while plexing multiplex cable comprising the steps of:
   (a) supplying lengths of insulated cable;
   (b) advancing each insulated cable along a straight path parallel to predetermined longitudinal axis;
   (c) testing said insulated cable for insulation faults while in said straight path by connecting the conductor of said insulated cable to ground, passing said insulated cable through an electrode concentric with said straight path, applying a high voltage signal to said electrode, establishing an electro motive force within said electrode, and detecting changes in said electrical signal caused by flow of electrons from said electro motive force through insulation faults to ground;
   (d) rotating each straight path about said longitudinal axis;
   (e) plexing each insulated cable around said longitudinal axis; and
   (f) collecting multiplex cable on storage means.

14. The method of claim 13 wherein the step of establishing an electro motive force further comprises the step of providing an electrical potential difference between said grounded conductor and said electrode.

15. The method of claim 13 further comprising the steps of:
   (a) supplying a length of insulated cable;
   (b) advancing said uninsulated cable along a path concentric with said predetermined longitudinal axis;
   (c) isolating said uninsulated conductor from said insulated conductors; and
   (d) plexing each insulated conductor with said uninsulated conductor.

16. The method of claim 15 wherein the step of isolating said uninsulated conductor further comprises the step of temporarily insulating said uninsulated conductor.

17. Apparatus for insulation fault testing and plexing strands of cable into multiplex cable comprising:
   (a) a frame rotatable about the longitudinal axis of the multiplex cable path;
   (b) an entrance disc secured to said frame, concentric with said longitudinal axis, and having a series of symmetrically spaced cable entrance guide means;
   (c) a fault tester disc secured to said entrance disc by insulating mounting means, concentric with said longitudinal axis, and having a series of symmetrically spaced cable testing means, said fault tester disc further comprising an insulator disc having a single central passageway, two or more intermediate cable testing passageways symmetrically spaced around said single central passageway, an electrode mounted in each intermediate cable testing passageway, and having brush bristles and brush holders which when assembled, form means for total contact around cable passing through said electrode, means for conducting an electrical signal between said electrode and an outer portion of said disc, and a contact ring concentric with said longitudinal axis mounted on an outer portion of said disc and contacting said means for conducting an electrical signal;
   (d) an exit disc for plexing said strands of cable, secured to said fault tester disc by insulating mounting means, concentric with said longitudinal axis, and having a series of symmetrically spaced cable exit guide means;
   (e) means for maintaining a straight cable path parallel to said longitudinal axis and rotatable about said longitudinal axis from each entrance guide means, through each cable testing means, and to each exit guide means;
   (f) means for rotating said frame, said entrance disc, said fault tester disc, and said exit disc along said longitudinal axis in unison;
   (g) means for transmitting fault data from said fault tester disc; and
   (h) means for applying a high voltage to said cable testing means thereby forming an electro motive force field around a portion of each strand to be tested.

18. The apparatus of claim 17 wherein said brush holders are formed in such a manner that when brush bristles are in the assembled brush holders, said bristles are at an angle approximately thirty clockwise angular degrees after perpendicular to the longitudinal axis of the path of cable through said electrode.

19. The apparatus of claim 17 wherein all parts of said electrode are removable from said fault tester disc and replacable without disturbing said cable.

20. The apparatus of claim 17 wherein said holders are formed in such a manner that when leading and following holders are aligned the ends of said holders are offset allowing complete contact among said holders.

21. The apparatus of claim 17 wherein said contact ring further comprises a copper ring mounted on the face of said fault tester disc nearest to said exit disc and having an inner diameter larger than the outer diameter of said exit disc.

22. Apparatus for insulation fault testing and plexing strands of cable into multiplex cable comprising:

(a) a frame rotatable about the longitudinal axis of the multiplex cable path;

(b) an entrance disc secured to said frame, concentric with said longitudinal axis, and having a series of symmetrically spaced cable entrance guide means, said entrance disc further comprising a disc having a single central passageway, two or more intermediate cable guide passageways symmetrically spaced around said single central passageway, two or more outer interconnection passageways, a polished ceramic insulator cable guide ring mounted in each cable guide passageway, and a snap locking plastic insulator detachably securing each polished ceramic insulator cable guide ring in each cable guide passageway;

(c) a fault tester disc secured to said entrance disc by insulating mounting means, concentric with said longitudinal axis, and having a series of symmetrically spaced cable testing means;

(d) an exit disc for plexing said strands of cable, secured to said fault tester disc by insulating mounting means, concentric with said longitudinal axis, and having a series of symmetrically spaced cable exit guide means;

(e) means for maintaining a straight cable path parallel to said longitudinal axis and rotatable about said longtiudinal axis from each entrance guide means, through each cable testing means, and to each exit guide means;

(f) means for rotating said frame, said entrance disc, said fault tester disc, and said exit disc along said longitudinal axis is unison;

(g) means for transmitting fault data from said fault tester disc; and (h) means for applying a high voltage to said cable testing means thereby forming an electro motive force field around a portion of each strand to be tested.

23. Apparatus for insulation fault testing and plexing strands of cable into multiplex cable comprising:

(a) a frame rotatable about the longitudinal axis of the mutliplex cable path;

(b) an entrance disc secured to said frame, concentric with said longitudinal axis, and having a series of symmetrically spaced cable entrance guide means;

(c) a fault tester disc secured to said entrance disc by insulating mounting means, concentric with said longitudinal axis, and having a series of symmetrically spaced cable testing means;

(d) an exit disc for plexing said strands of cable, secured to said fault tester disc by insulating mounting means, concentric with said longitudinal axis, and having a series of symmetrically spaced cable exit guide means, said exit disc further comprising a single central passageway, two or more intermediate cable guide passageways symmetrically spaced around said single central passageway, two or more outer interconnection passageways, a polished ceramic insulator cable guide ring mounted in each cable guide passageway, and a snap locking plastic insulator detachably securing each polished ceramic insulator cable guide ring in each cable guide passageway;

(e) means for maintaining a straight cable path parallel to said longitudinal axis and rotatable about said longitudinal axis from each entrance guide means, through each cable testing means, and to each exit guide means;

(f) means for rotating said frame, said entrance disc, said fault tester disc, and said exit disc along said longitudinal axis in unison;

(g) means for transmitting fault data from said fault tester disc; and (h) means for applying a high voltage to said cable testing means thereby forming an electro motive force field around a portion of each strand to be tested.

24. Apparatus for insulation fault testing and plexing strands of cable into multiplex cable comprising:

(a) a frame rotatable about the longitudinal axis of the multiplex cable path;

(b) an entrance disc secured to said frame, concentric with said longitudinal axis, and having a series of symmetrically spaced cable entrance guide means;

(c) a fault tester disc secured to said entrance disc by insulating mounting means, concentric with said longitudinal axis, an having a series of symmetrically spaced cable testing means, and further comprising an insulator disc having a single central passageway, two or more intermediate cable testing passageways symmetrically spaced around said single central passageway, an electrode mounted in each intermediate cable testing passageway, and having a first housing longitudinally extending from said fault tester disc toward said entrance disc, a second housing longitudinally extending from said fault tester disc toward said exit disc, and a multiplicity of electrode brush inserts mounted within said housing forming an elongated testing zone about the path of said cable, means for conducting an electrical signal between said electrode an outer portion of said disc, and a contact ring concentric with said longitudinal axis mounted on an outer portion of said disc and contacting said means for conducting an electrical signal;

(d) an exit disc for plexing said strands of cable, secured to said fault tester disc by insulating mounting means, concentric with said longitudinal axis, and having a series of symmetrically spaced cable exit guide means;

(e) means for maintaining a straight cable path parallel to said longitudinal axis and rotatable about said longitudinal axis from each entrance guide means through each cable testing means, and to each exit guide means;

(f) means for rotating said frame, said entrance disc, said fault tester disc, and said exit disc along said longitudinal axis in unison;

(g) means for transmitting fault data from said fault tester disc; and (h) means for applying a high voltage to said cable testing means thereby forming an electro motive force field around a portion of each strand to be tested.

25. Apparatus for insulation fault testing and plexing strands of cable into mulitplex cable comprising:

(a) a frame rotatable about the longitudinal axis of the multiplex cable path;

(b) an entrance disc secured to said frame, concentric with said longitudinal axis, and having a series of symmetrically spaced cable entrance guide means;

(c) a fault tester disc secured to said entrance disc by insulating mounting means, concentric with said longitudinal axis, and having a series of symmetrically spaced cable testing means, said exit disc further comprising a solid PVC insulator disc having a single central passageway, two or more intermediate cable testing passageways symmetrically spaced around said single central passageway, an electrode mounted in each intermediate cable testing passageway, means for conducting an electrical signal between said electrode and an outer portion of said disc, and a contact ring concentric with said longitudinal axis mounted on an outer portion of said disc and contacting said means for conducting an electrical signal;

(d) an exit disc for plexing said strands of cable, secured to said fault tester disc by insulating mounting means, concentric with said longitudinal axis, and having a series of symmetrically spaced cable exit guide means;

(e) means for maintaining a straight cable path parallel to said longitudinal axis and rotatable about said longitudinal axis from each entrance guide means, through each cable testing means, and to each exit guide means;

(f) means for rotating said frame, said entrance disc, said fault tester disc, and said exit disc along said longitudinal axis in unison;

(g) means for transmitting fault data from said fault tester disc; and (h) means for applying a high voltage to said cable testing means thereby forming an electro motive force field around a portion of each strand to be tested.

26. Apparatus for insulation fault testing and plexing strands of cable into multiplex cable comprising:

(a) a frame rotatable about the longitudinal axis of the multiplex cable path;

(b) an entrance disc secured to said frame, concentric with said longitudinal axis, and having a series of symmetrically spaced cable entrance guide means;

(c) a fault tester disc secured to said entrance disc by insulating mounting means, concentric with said longitudinal axis, and having a series of symmetrically spaced cable testing means, said fault tester disc further comprising, an insulator disc having single central passageway, two or more intermediate cable testing passageways symmetrically spaced around said single central passageway, an electrode mounted in each intermediate cable testing passageway, means for conducting an electrical signal between said electrode and an outer portion of said disc, and a copper contact ring concentric with said longitudinal axis mounted on an outer portion of said disc and contacting said means for conducting an electrical signal, mounted on the face of said fault tester disc nearest to said exit disc and having an inner diameter larger than the outer diameter of said exit disc;

(d) an exit disc for plexing said strands of cable, secured to said fault tester disc by insulating mounting means, concentric with said longitudinal axis, and having a series of symmetrically spaced cable exit guide means;

(e) means for maintaining a straight cable a path parallel to said longitudinal axis and rotatable about said longitudinal axis from each entrance guide means, through each cable testing means, and to each exit guide means;

(f) means for rotating said frame, said entrance disc, said fault tester disc, and said exit disc along said longitudinal axis in unison;

(g) means for transmitting fault data from said fault tester disc; and (h) means for applying a high voltage to said cable testing means thereby forming an electro motive force field around a portion of each strand to be tested.

* * * * *